(12) United States Patent
Mayer

(10) Patent No.: US 10,456,668 B2
(45) Date of Patent: *Oct. 29, 2019

(54) INTERACTIVE GREETING CARD

(71) Applicant: American Greetings Corporation, Cleveland, OH (US)

(72) Inventor: David Mayer, Bay Village, OH (US)

(73) Assignee: American Greetings Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/691,056

(22) Filed: Aug. 30, 2017

(65) Prior Publication Data

US 2017/0361220 A1   Dec. 21, 2017

Related U.S. Application Data

(60) Continuation of application No. 15/199,086, filed on Jun. 30, 2016, now Pat. No. 9,751,007, which is a continuation of application No. 14/226,550, filed on Mar. 26, 2014, now Pat. No. 9,434,202, which is a division of application No. 13/798,375, filed on Mar. 13, 2013, now Pat. No. 8,726,548.

(Continued)

(51) Int. Cl.
| | | |
|---|---|---|
| *A63F 13/2145* | (2014.01) | |
| *A63F 13/837* | (2014.01) | |
| *A63F 13/22* | (2014.01) | |
| *B42D 15/02* | (2006.01) | |

(52) U.S. Cl.
CPC .......... *A63F 13/2145* (2014.09); *A63F 13/22* (2014.09); *A63F 13/837* (2014.09); *B42D 15/02* (2013.01)

(58) Field of Classification Search
None
See application file for complete search history.

(56) References Cited

U.S. PATENT DOCUMENTS

| | | |
|---|---|---|
| 2,619,349 A | 11/1952 | Abrahamson |
| 5,709,385 A | 1/1998 | Fitzpatrick et al. |
| (Continued) | | |

FOREIGN PATENT DOCUMENTS

| | | |
|---|---|---|
| GB | 2336808 | 3/1999 |
| WO | WO2011-107888 | 9/2011 |

OTHER PUBLICATIONS

Office action for U.S. Appl. No. 15/199,086, dated Apr. 18, 2017, Mayer, "Interactive Greeting Card", 4 pages.

*Primary Examiner* — David R Dunn
*Assistant Examiner* — Christopher E Veraa
(74) *Attorney, Agent, or Firm* — Lee & Hayes, P.C.

(57) ABSTRACT

An integral greeting card/game is disclosed wherein a multi-panel greeting card also serves as a game board and is combined with a game piece and launch mechanism to create a novel, interactive greeting card. The multi-panel greeting card contains a sound module therein and a magnetic trigger is contained and concealed below one or more of the multiple greeting card panels. The game piece contains a magnet therein so that when the game piece comes into contact with the area of the greeting card above or proximate to the magnetic trigger, playback of an audio file is initiated. In one embodiment, the game piece is operative to interact with a touch screen of a mobile device.

20 Claims, 9 Drawing Sheets

Related U.S. Application Data

(60) Provisional application No. 61/679,888, filed on Aug. 6, 2012.

(56) References Cited

U.S. PATENT DOCUMENTS

| | | |
|---|---|---|
| 6,108,656 A | 8/2000 | Durst et al. |
| 6,542,933 B1 | 4/2003 | Durst, Jr. et al. |
| 6,682,099 B1 * | 1/2004 | Laurash ............ B42D 15/02 283/101 |
| 8,065,385 B2 | 11/2011 | Altounian et al. |
| 8,150,942 B2 | 4/2012 | Kindberg et al. |
| 8,512,151 B1 | 8/2013 | Mkrtchyan |
| 8,682,802 B1 | 3/2014 | Kannanari |
| 2003/0001016 A1 | 1/2003 | Fraier et al. |
| 2003/0018541 A1 | 1/2003 | Nohr |
| 2004/0139318 A1 | 7/2004 | Fiala et al. |
| 2004/0214642 A1 | 10/2004 | Beck |
| 2004/0248650 A1 | 12/2004 | Colbert et al. |
| 2006/0160617 A1 | 7/2006 | Hansen et al. |
| 2006/0246403 A1 | 11/2006 | Monpouet et al. |
| 2007/0011138 A1 | 1/2007 | Boucard |
| 2007/0018390 A1 | 1/2007 | Sumner et al. |
| 2007/0151131 A1 * | 7/2007 | Clegg ............ G11B 33/0488 40/124.03 |
| 2008/0009345 A1 | 1/2008 | Bailey et al. |
| 2008/0121442 A1 | 5/2008 | Boer et al. |
| 2008/0209534 A1 | 8/2008 | Keronen et al. |
| 2009/0014951 A1 | 1/2009 | Gough |
| 2009/0315257 A1 | 12/2009 | Blumenstock et al. |
| 2010/0004062 A1 | 1/2010 | Maharbiz et al. |
| 2010/0032900 A1 | 2/2010 | Wilm |
| 2010/0164836 A1 | 7/2010 | Liberatore |
| 2010/0301117 A1 | 12/2010 | Hubber et al. |
| 2010/0331083 A1 | 12/2010 | Maharbiz et al. |
| 2011/0035264 A1 | 2/2011 | Zaloom |
| 2012/0007817 A1 | 1/2012 | Heatherly et al. |
| 2012/0049453 A1 | 3/2012 | Morichau-Beauchant et al. |
| 2012/0055053 A1 * | 3/2012 | Guo ............ B42D 15/022 40/124.03 |
| 2012/0278189 A1 | 11/2012 | Goldberg et al. |
| 2013/0012313 A1 | 1/2013 | Chen |
| 2013/0130779 A1 | 5/2013 | Gagner et al. |
| 2013/0166455 A1 | 6/2013 | Feigelson |
| 2013/0225280 A1 | 8/2013 | Levine |
| 2014/0038720 A1 | 2/2014 | Reeskamp et al. |
| 2016/0375359 A1 | 12/2016 | Mayer |

* cited by examiner

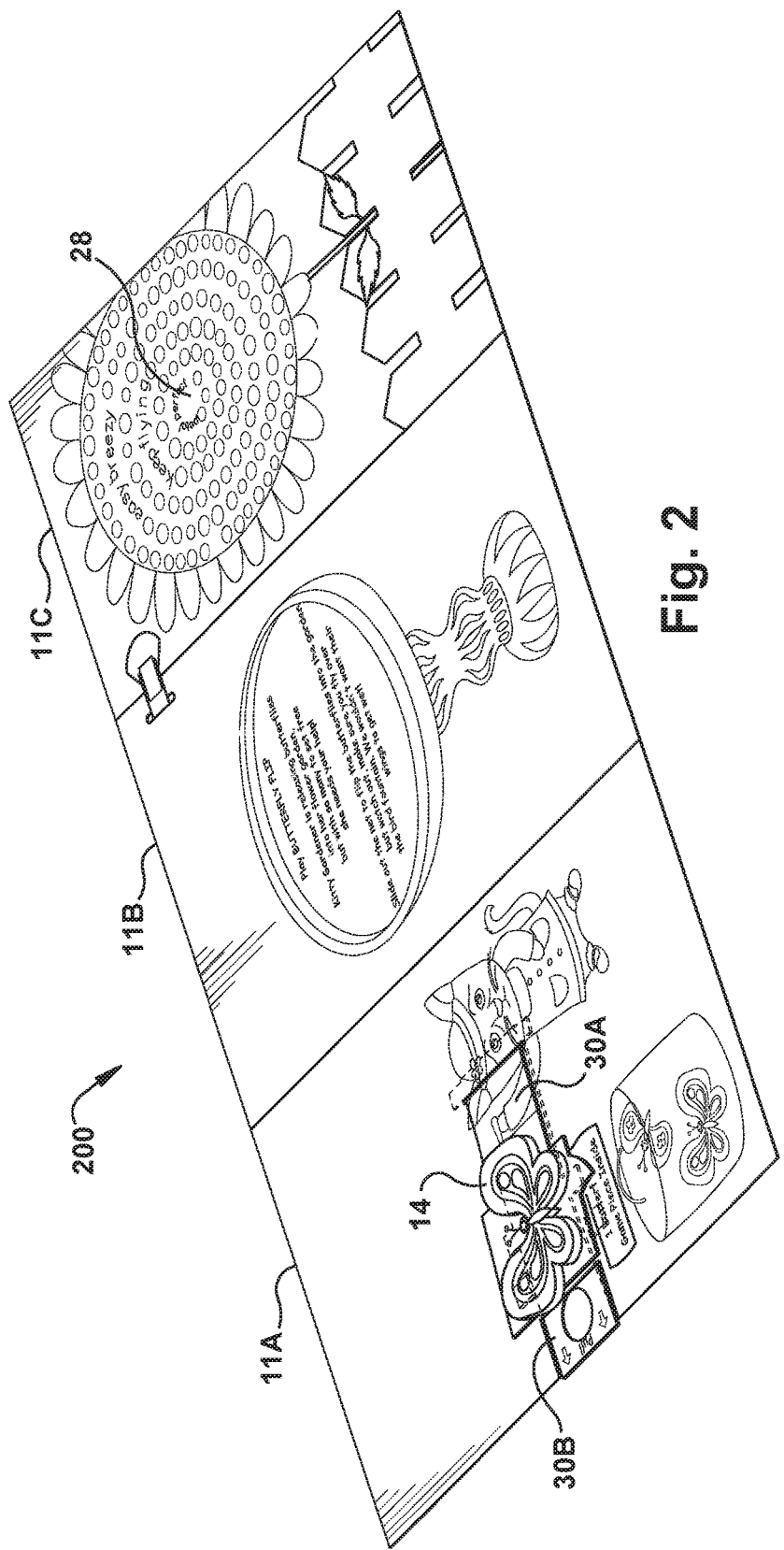

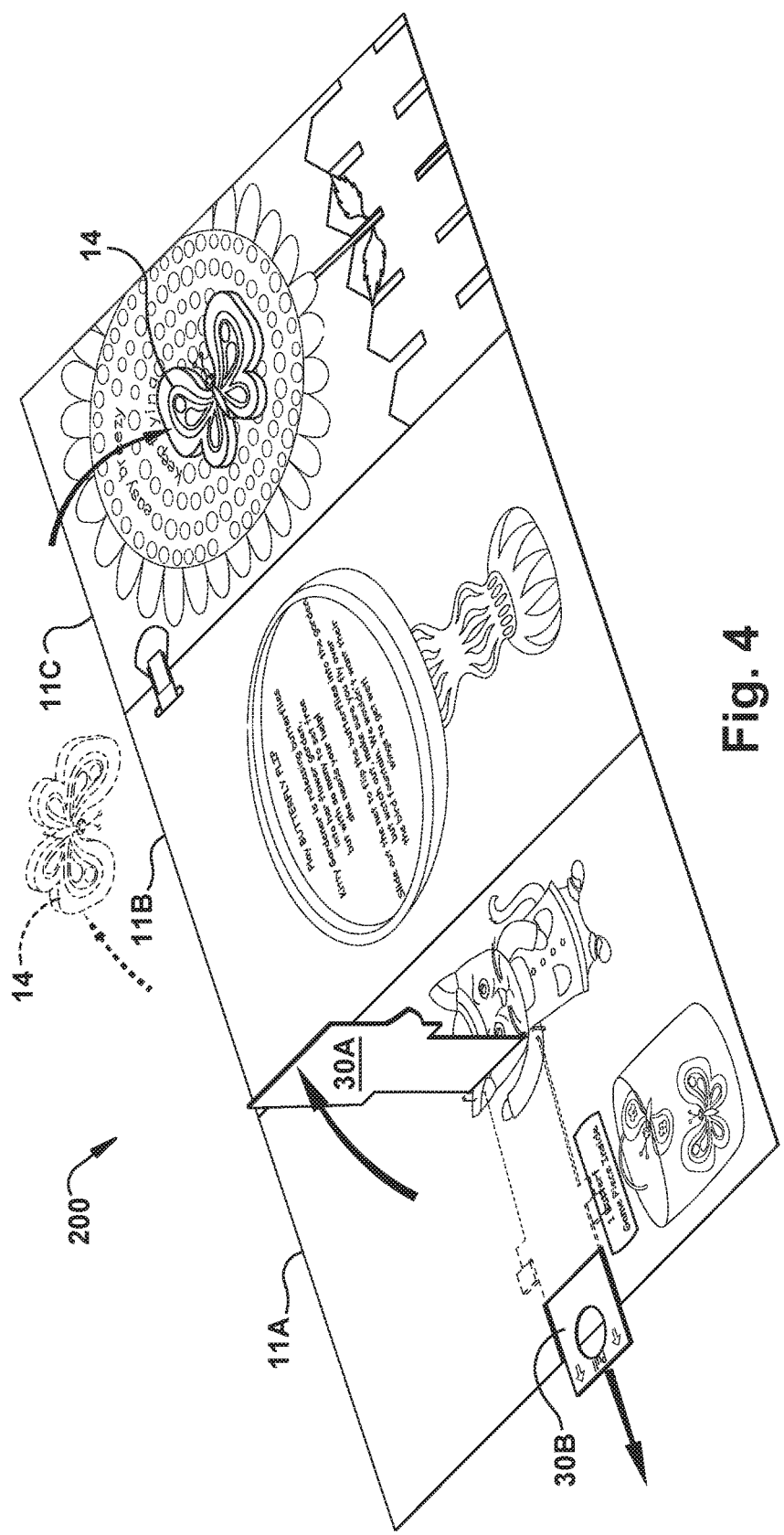

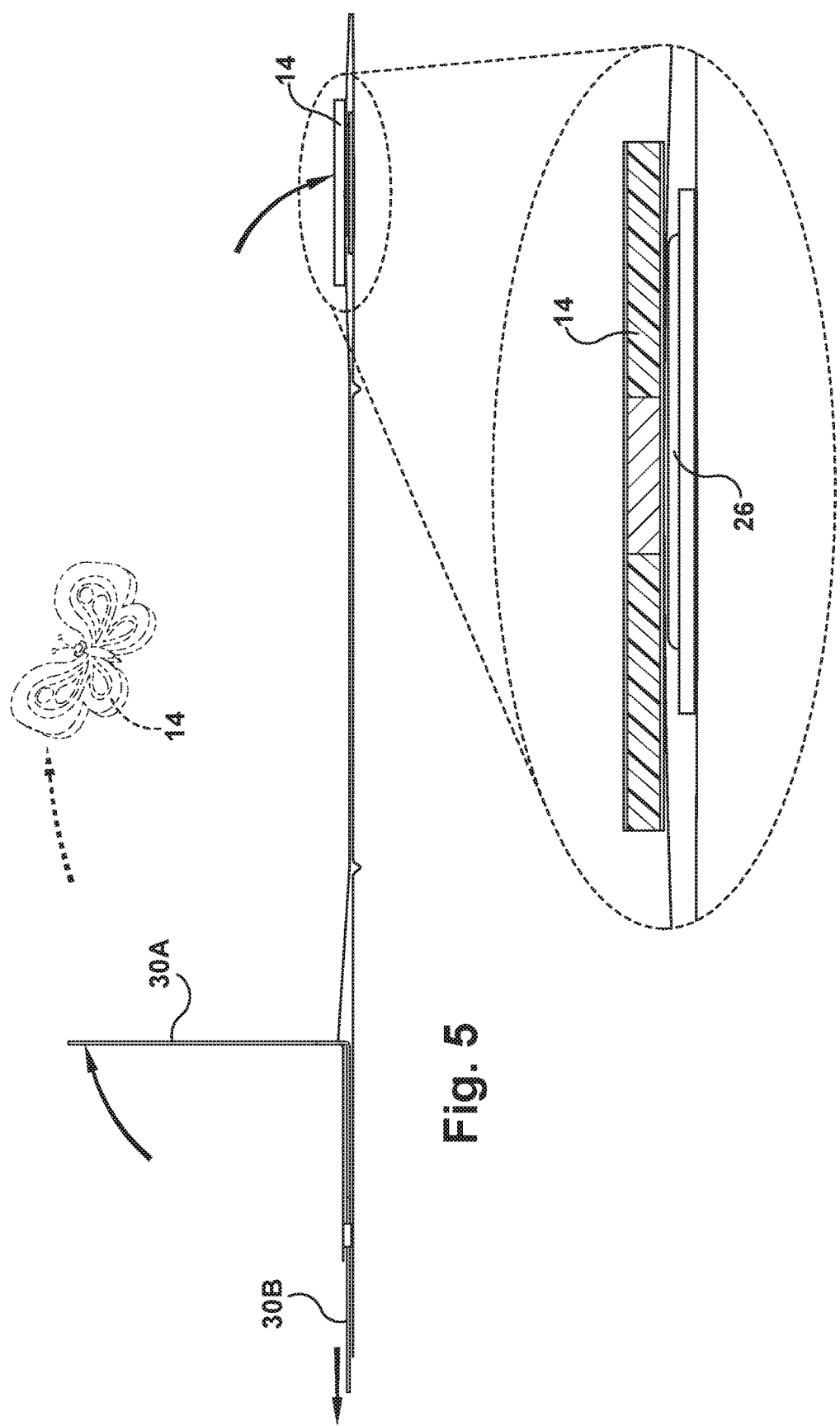

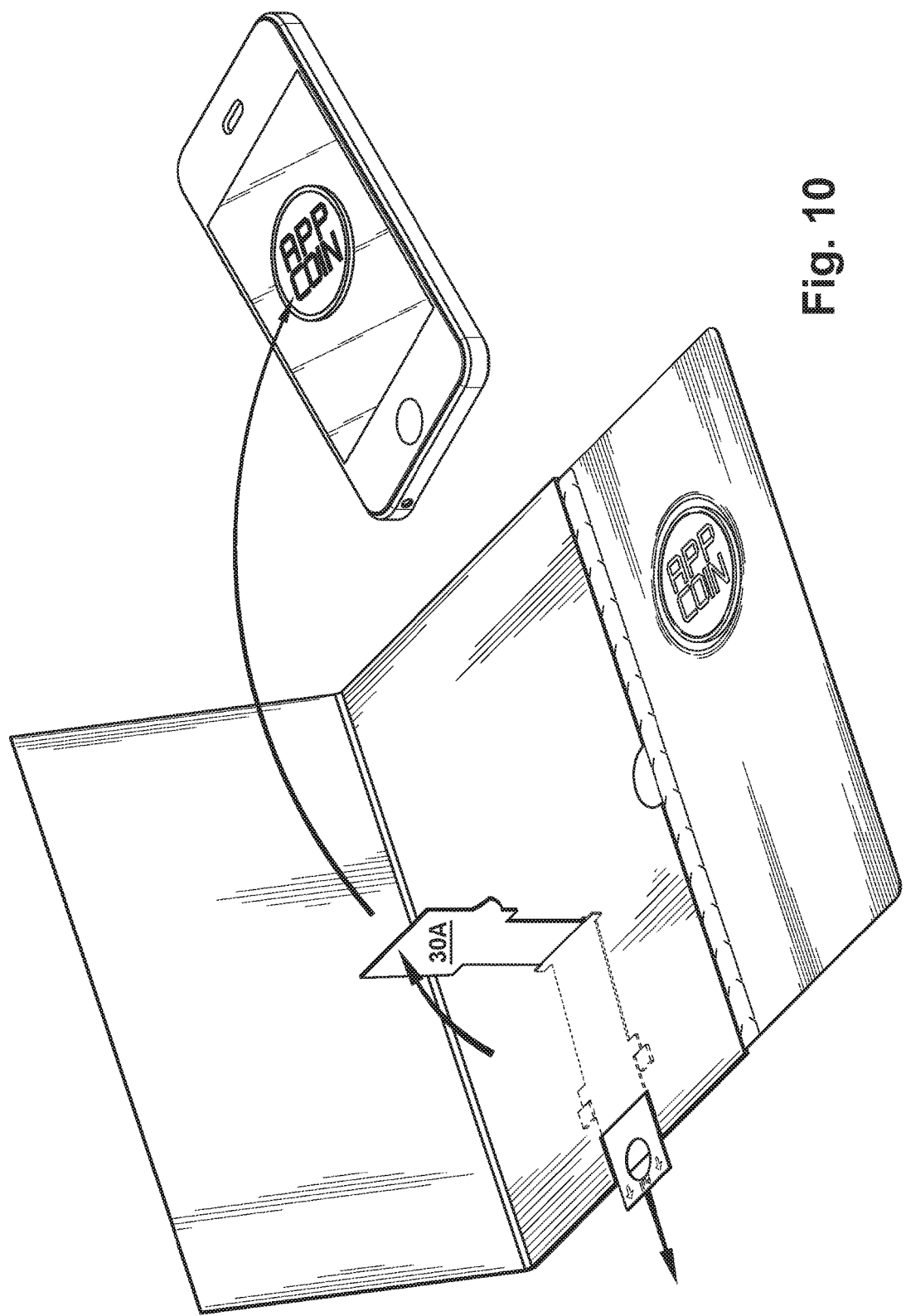

INTERACTIVE GREETING CARD

RELATED APPLICATIONS

This application is a continuation of U.S. patent application Ser. No. 15/199,086, filed on Jun. 30, 2016, which is a continuation of U.S. patent application Ser. No. 14/226,550, filed on Mar. 26, 2014, (now U.S. Pat. No. 9,434,202), which is a divisional of U.S. patent application Ser. No. 13/798,375, filed on Mar. 13, 2013, (now U.S. Pat. No. 8,726,548), which claims priority to U.S. Provisional Patent Application No. 61/679,888, filed on Aug. 6, 2012. Each of the above-referenced patent applications is incorporated herein by reference in its entirety.

FIELD OF THE INVENTION

The present invention is in the field of social expression products. More specifically, the invention is directed to an interactive greeting card with game.

SUMMARY OF THE INVENTION

An integral greeting card/game is disclosed wherein a multi-panel greeting card also serves as a game board and is combined with a game piece and launch mechanism to create a novel, interactive greeting card. The multi-panel greeting card contains a sound module therein and a magnetic trigger is contained and concealed below one or more of the multiple greeting card panels. The game piece contains a magnet therein so that when the game piece comes into contact with the area of the greeting card above or proximate to the magnetic trigger, playback of an audio file is initiated.

DESCRIPTION OF THE DRAWINGS

FIG. 2 is a perspective view of the greeting card of FIG. 1 in an open position.

FIG. 3 is a side view of the greeting card of FIG. 2.

FIG. 4 is a perspective view of the greeting card of FIG. 2, in an open position showing the operation of the launch mechanism.

FIG. 5 is a side view of the greeting card of FIG. 4.

FIG. 10 is a perspective view of the greeting card showing interaction between the game piece associated with the greeting card of the present disclosure and the touch screen of a mobile device.

DETAILED DESCRIPTION OF PREFERRED AND ALTERNATE EMBODIMENTS

The interactive greeting card of the present invention combines a paper greeting card with an interactive game with game piece and launcher, pop-up structure and audio capabilities. The greeting card may be used to convey a message or greeting and then be enjoyed by the greeting card recipient long after the giving occasion.

Figure 1:
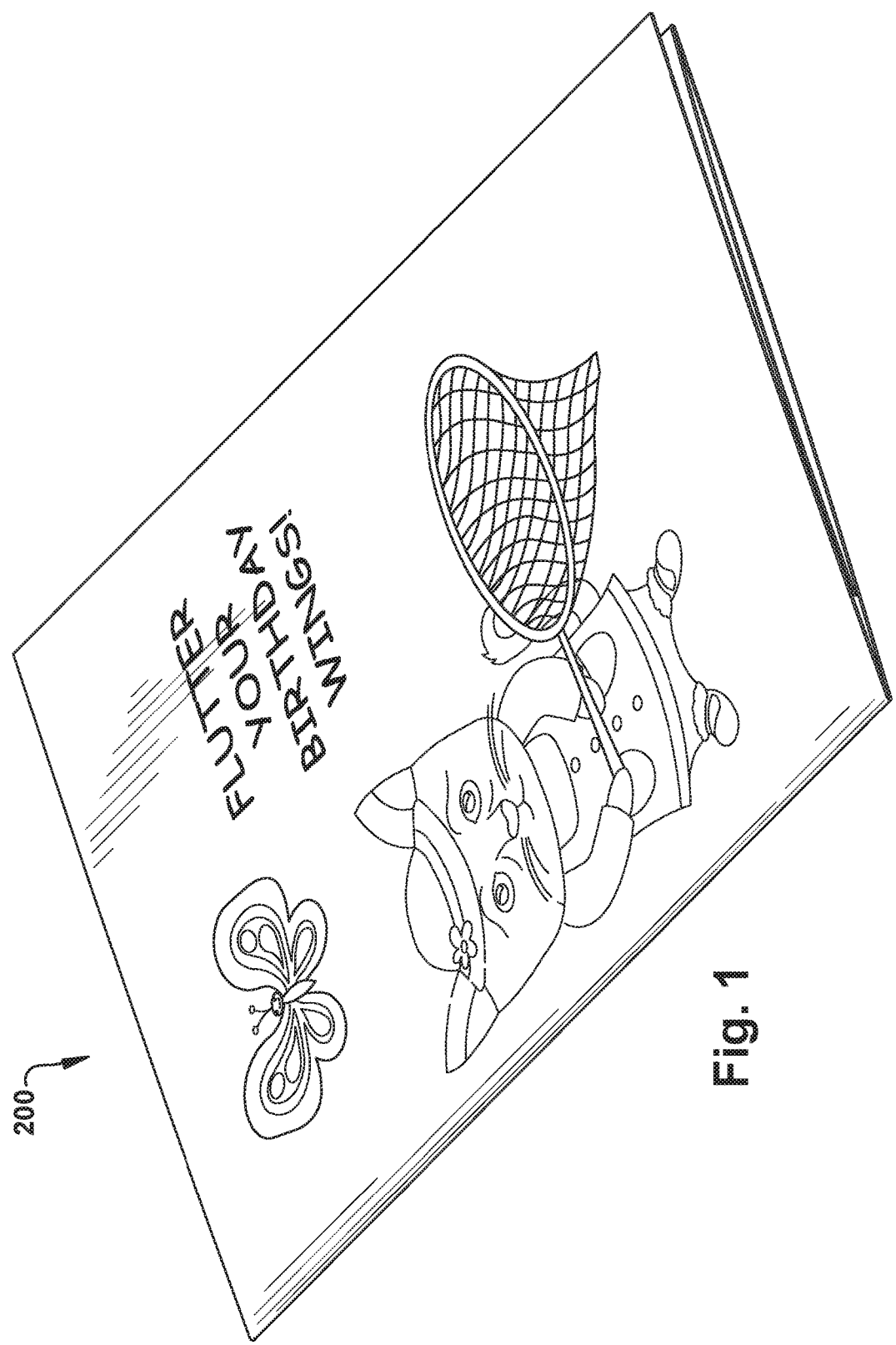
FIG. 1 is a perspective view of one embodiment of the greeting card of the present invention.
Figure 6:
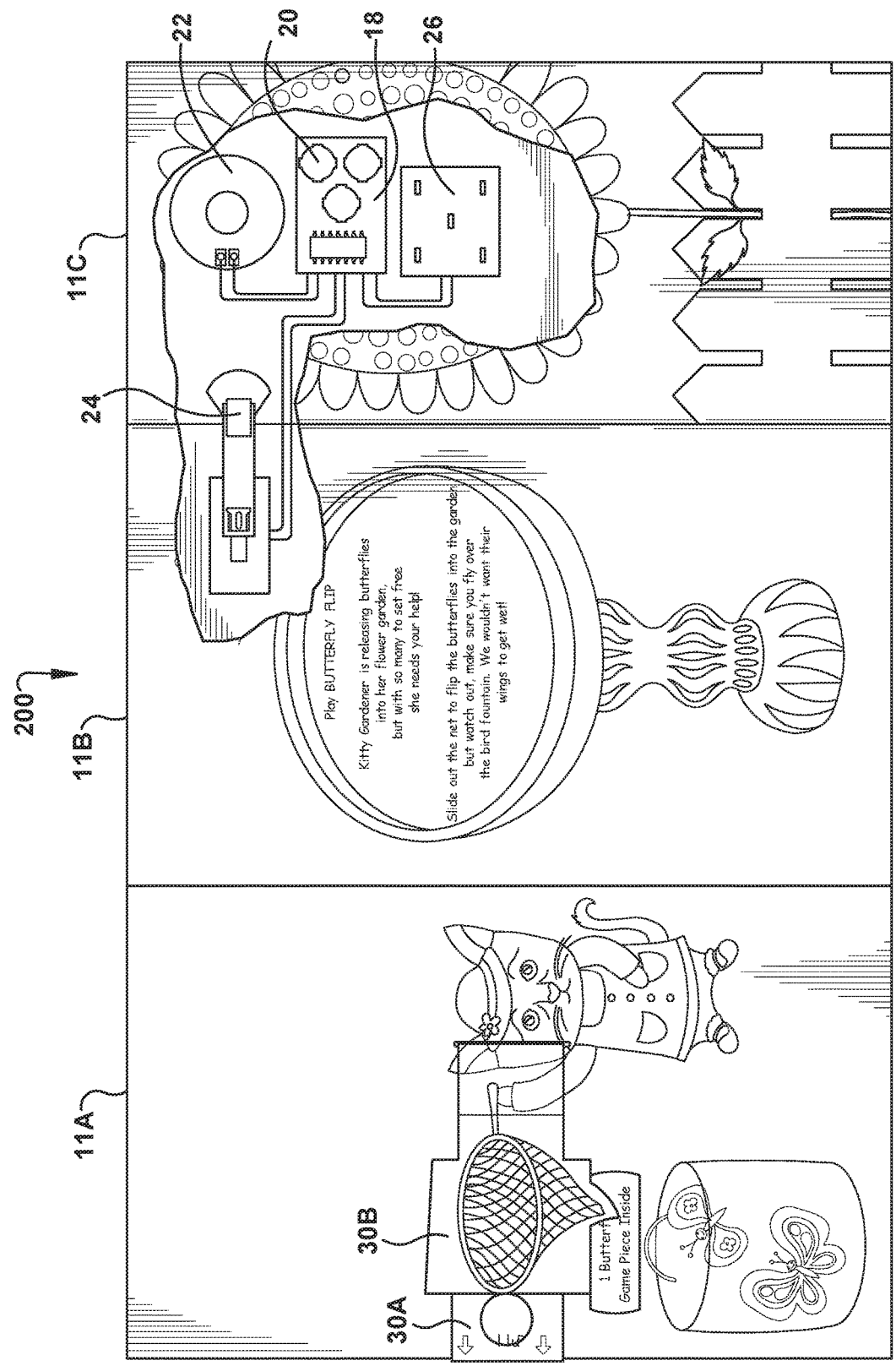
FIG. 6 is a top partial tear-away view of the greeting card of FIG. 2.
Figure 7:
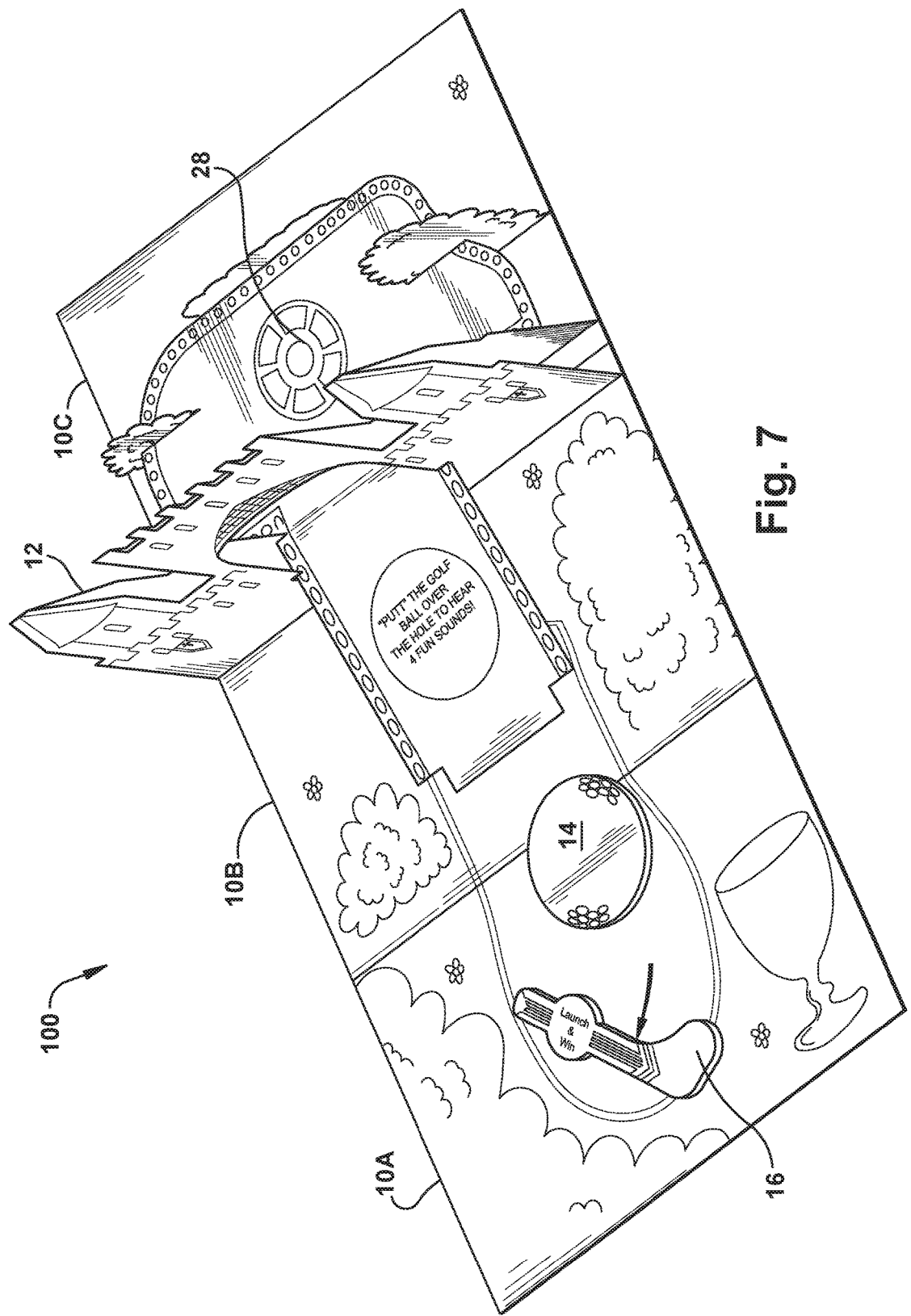
FIG. 7 is a perspective view of another embodiment of the greeting card of the present invention.
Figure 8:
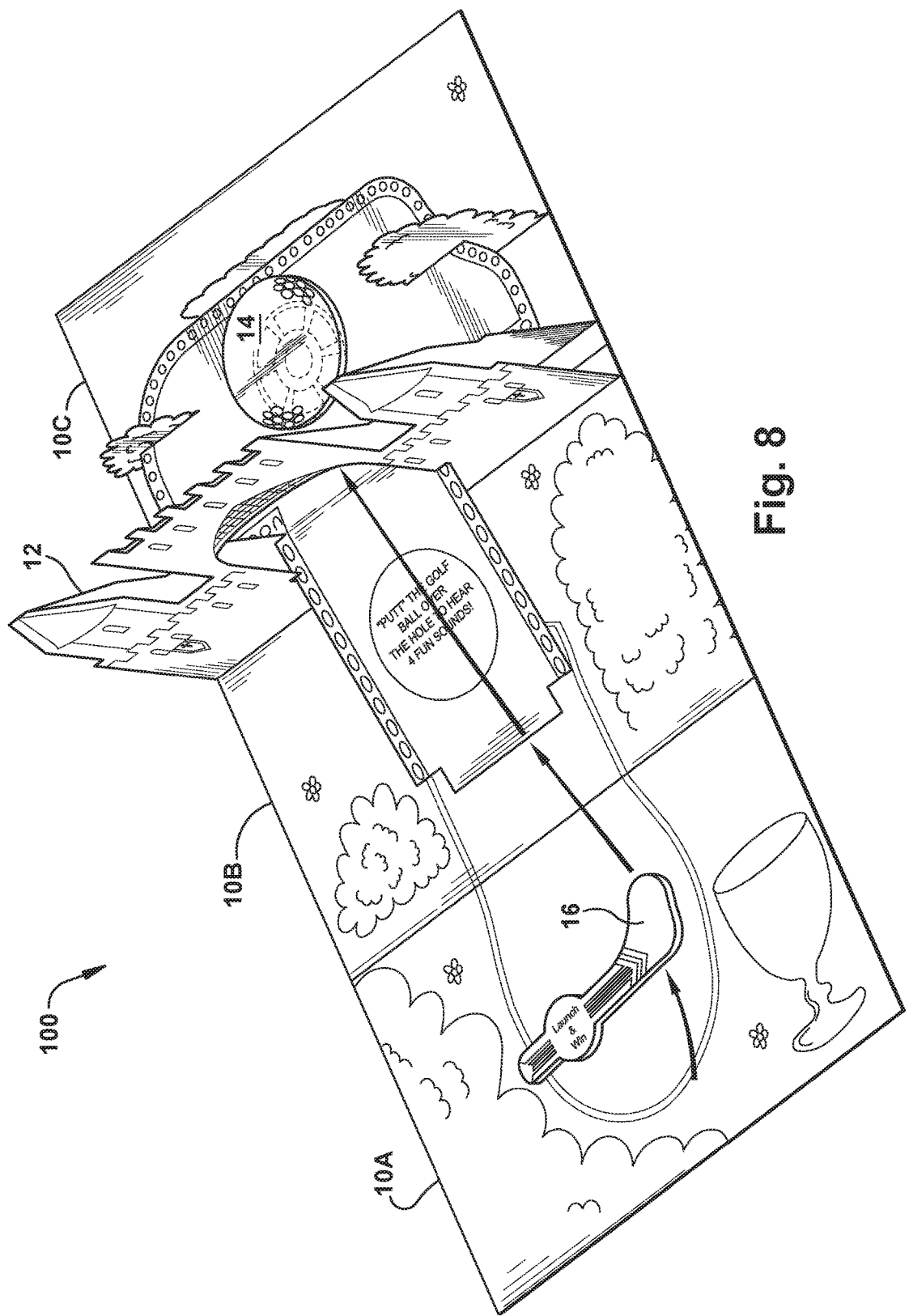
FIG. 8 is a perspective view of the greeting card of FIG. 7, showing the operation of the launch mechanism.
Figure 9:
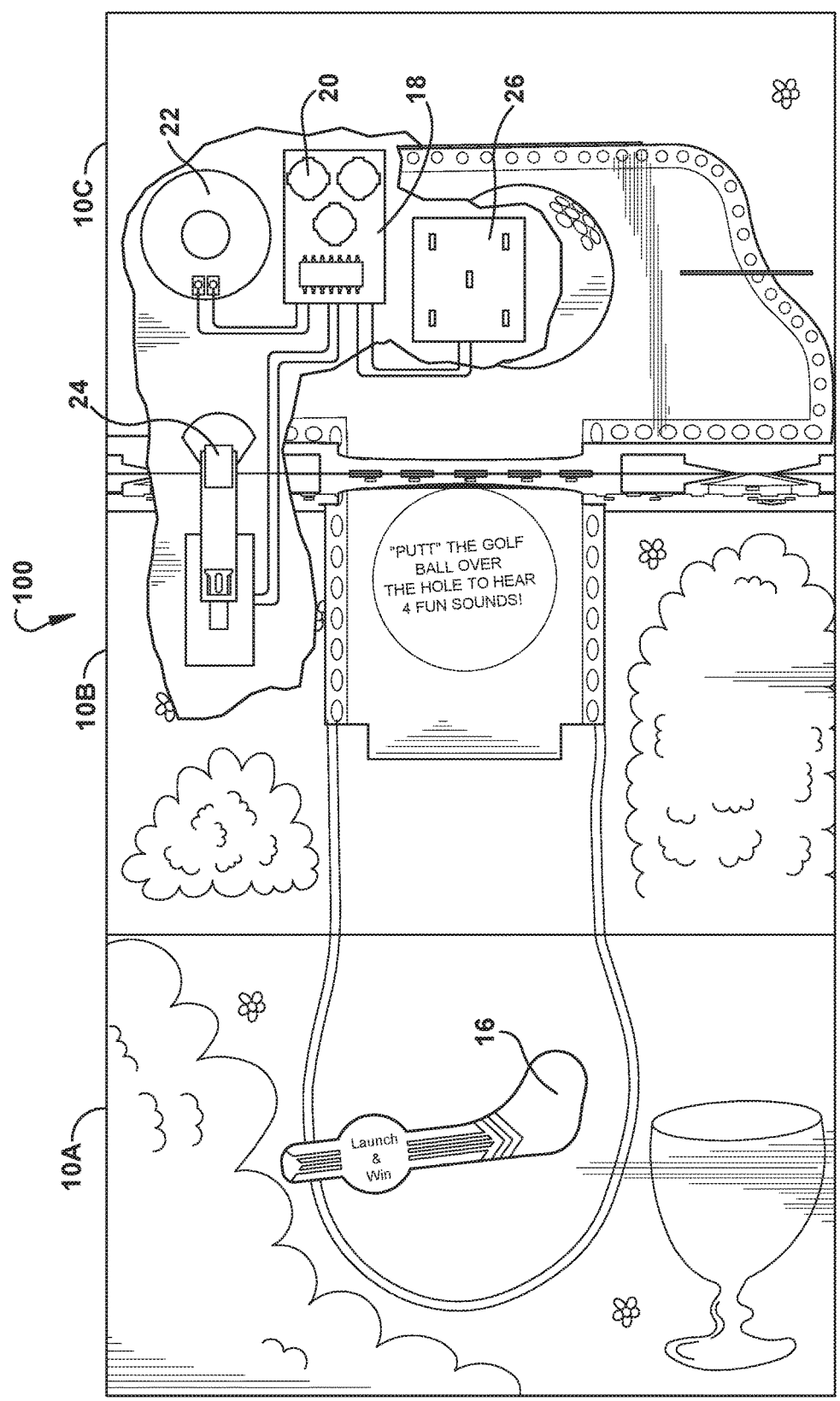
FIG. 9 is a top partial tear-away view of the greeting card of FIG. 7.

In one embodiment, shown in FIGS. 7 through 9, the greeting card 100 includes a greeting card body which comprises multiple greeting card panels attached along various fold lines and a pop-up structure 12 located on the inside of the greeting card 100 wherein in a first position the pop-up structure 12 is folded neatly into a flat position between at least two panels of the greeting card body and a second position wherein the pop-up structure 12 is unfolded into an intricate three-dimensional structure (shown in FIG. 7). The pop-up structure 12 may be attached to one or more of the multiple greeting card panels 10A, 10B, 10C. In one embodiment, shown in FIGS. 7 through 9, the pop-up structure 12, in the second, unfolded position is arranged like a castle with various connected die cut shapes or pieces attached along various fold lines and/or otherwise interconnected. The pop-up structure 12 may have an opening or a receptacle included therein with which the user will interact while playing the game. A separate game piece 14 and launch mechanism 16 are included within the greeting card 100. The game piece 14 and launch mechanism 16 may be made of paper, cardboard, foam, plastic or any other suitable material. The game piece 14 and launch mechanism 16 are removably attached to the greeting card body via glue other attachment mechanism or may be placed into a transparent plastic sleeve or other encasement which is removably attached to the greeting card body. In one embodiment, the game piece 14 is a circular foam shaped article having a front substantially planar surface, a back substantially planar surface opposite the front surface, and a perimeter extending therebetween. The thickness of the foam piece (or perimeter) is preferably very thin. The front and back surfaces of the foam article 14 may be covered by a thin sheet or cover material which may contain printing thereon to make the article resemble a golf ball (or other type of ball or game item). The launch mechanism 16 is also a foam shaped article having a front substantially planar surface, a back substantially planar surface and a perimeter therebetween. Like the game piece 14, the launch mechanism 16 may have a front and back cover material attached to the front and back surface with printing thereon to make the article resemble a golf club (or baseball bat, hockey stick, etc.). In one embodiment, the launch mechanism 16 is positioned horizontally and attached on one side to a spring loaded mechanism, which is located within (and concealed by) the greeting card body. The launch mechanism 16 is operative to partially pivot about a pivot point (or point where the launch mechanism 16 is attached to the spring loaded device) and works by pulling one side of the launch mechanism 16 back (stretching out the spring) and then letting go (allowing the spring to return to its original unstretched position). Placing a game piece 14 in front of the launch mechanism 16, pulling the launch mechanism 16 back and then letting go will move or project the game piece 14 forward, in a substantially horizontal direction over the game board. The game pieces 14 may be initially wrapped in a protective clear coating such as a clear plastic envelope or may be attached directly to the greeting card body. A sound module which is operative to store and playback at least one audio file is contained and concealed within the greeting card body, such as between two or more greeting card panels. The sound module may contain various electronic components including but not limited to: a circuit board 18, an integrated circuit, a power source 20, a memory device containing at least one digital audio file, a speaker 22, and any other component which enables storage and playback of digital audio files. A first trigger mechanism or switch 24 is contained within the greeting card 100, such as a slide switch which is located across one of the greeting card fold lines so that when the greeting card 100 is opened, a first or initial audio clip is played. A second trigger mechanism or switch, such as, in a preferred embodiment, a magnetic switch 26 is located within the greeting card body 100 (between the greeting card panels or within the pop-up structure). A small magnet is contained within the game piece 14 such that when the game piece 14 comes in contact with the area of the greeting card 100 above or proximate to the magnetic trigger 26, playback of the at least one digital audio file is initiated.

In operation, the greeting card 100 may be a gatefold greeting card having right 10C, left 10A and center 10B panels connected along two vertical fold lines. Opening the greeting card 100 by, for example, moving the left 10A and right 10C greeting card panels away from the center panel 10B, exposes the pop-up structure 12, game piece 14 and launcher mechanism 16 and also initiates playback of an audio clip. The inside surface of the greeting card panels 10A, 10B, 10C contain printing and graphics thereon to resemble or simulate a game board. As mentioned above, in one example, the pop-up structure 12 resembles a castle, having a die flat piece which represents a drawbridge and extends between the pop-up castle structure and inside surface of the greeting card or game board. The object of the game is to use the launch mechanism 16 to move or thrust the game piece 14 to the "payoff" area 28 of the greeting card 100. The "payoff" area 28 is above or proximate to the magnetic trigger 26. This area 28 is indicated, in connection with the game theme of the current example, as a golf hole. The greeting card 100 may contain other text printed thereon which describes the game to the user or tells the user how to initiate the sound playback. Once the game piece 14 comes in contact with the "payoff" area 28 (by moving the magnet to the magnetic trigger), playback of an audio file is initiated. The user may continue to play the game by continuously attempting to use the launch mechanism 16 to move the game piece 14 over the game board and onto the "payoff" area 28. Different audio clips may be replayed each time the game piece 14 comes in contact with the "payoff" area 28 of the greeting card 100 or the same audio clip may be continuously replayed. There may be a plurality of sound clips saved within the sound module which may be played back in sequence or at random. If the sounds are played back in sequence (or on a loop), once all of the clips have been replayed during a single game, the loop with repeat again at the beginning. Once the greeting card 100 remains open without any interaction with the "payoff" area 28, the sound module may trigger playback of a message instructing the user to close and reopen the greeting card to play again or to indicate "game over". The greeting card 100 may contain any number of greeting card panels and may be printed to look like any type of game board or sports venue. The trigger mechanism 26, while described herein as being a magnetic trigger, may be of any other type. The pop-up structure 12 may also be of any shape or structure. Likewise, the game piece 14 and launch mechanism 16 can be shaped and have printing thereon to resemble any type of game (hockey stick/hockey puck; shuffleboard paddle/shuffleboard puck; etc.) or other amusement device. Preferably, the greeting card (game board) 100, pop-up structure 12, game piece 14, launch mechanism 16 and audio clips are all related to the same theme or game.

In a second embodiment, shown in FIGS. 1 through 6, the greeting card 200 does not contain a pop-up structure as described above with respect to the first embodiment, although the greeting card 200, game piece 14, magnetic trigger 24, and sound module are as described above with respect to the first embodiment. However, in this embodiment, the launch mechanism 30 is a flip-type launcher which moves a game piece 14 through the air, instead of horizontally across the game board, as described above. The flip-type launch mechanism 30 may be a simple cardboard die cut piece which has a launch portion 30A and a pull-ring portion 30B. The launch portion 30A and pull-ring portion 30B of the launch mechanism 30 may be made of a single contiguous piece of paperboard (or other such material). The launch portion 30A is substantially planar die cut piece operative to move between a first position, wherein the launch portion 30A is laid flat in a substantially horizontal position parallel (and in contact with or very close) to the game board surface (or inside of the greeting card), as shown in FIGS. 2 and 3, and a second position wherein the launch portion 30A is in a substantially upright or standing position, as shown in FIGS. 4 and 5. The pull-ring portion 30B is located below the launch portion 30A and is parallel to the launch portion 30A when the launch portion 30A is in the first or horizontal position. It is capable of moving from a first position wherein the pull-ring portion 30B is substantially contained within the greeting card body, as shown in FIG. 2, and a second position wherein the pull-ring portion 30B is partially outside of the greeting card body, as shown in FIG. 4. The pull-ring portion 30B has a circular cut-out in which a user can insert his/her forefinger to move the launch mechanism 30 from the first position to the second position. Alternatively, the launch mechanism may be of the type described above with respect to the first embodiment. The magnetic trigger 24 would be located within the greeting card body, such as beneath one of the greeting card panels 11A, 11B, 11C. At least one of the greeting card panels 11A, 11B, 11C contains a closed cavity therein. The pull-ring launch mechanism 30 can be used to launch a game piece 14 into the air, aiming for the "payoff" area 28 of the greeting card 200 which will initiate audio playback. For example, the game piece 14 may be a butterfly and the greeting card panels 11A, 11B, 11C may be printed with one or more flowers beneath which lies a magnetic (or other type) switch 26 operable to trigger audio playback. The object is to launch the butterfly onto the one or more flowers to hear the audio payoff. The greeting card 200 may contain a single "payoff" area or may contain two or more different "payoff" areas.

In a third embodiment, the greeting card is a combination of the first and second embodiments described above. It contains a pop-up structure as described above with respect to the first embodiment and a launch mechanism as described above with respect to the second embodiment. The greeting card structure, game piece, magnetic switch and sound module are also described above with respect to the first and second embodiments. The game piece, as described above, is a thin piece of foam or other lightweight material which has a planar front surface and a planar back surface opposite the front surface and a perimeter therebetween. The front and back surfaces of the game piece may be covered by a thin sheet or cover material which may contain printing thereon to make the article resemble an animated character or other entertaining figure. To play the game, the user places the game piece onto the planar portion of the launch mechanism, inserts his/her finger into the circular cut-out and pulls back so that the pull-ring portion moves outward, away from the greeting card and the planar portion moves into an upstanding, vertical position, thereby "launching"

the game piece through the air. To start again, the user must push the pull-ring portion back into its original position and replace the game piece onto the launch portion. As discussed above, the greeting card contains a pop-up structure which may be of any shape and construct. The magnetic trigger is located somewhere on the pop-up structure or on or within the greeting card panels. The "payoff" area is indicated on the greeting card as the position where the game piece must land to initiate the audio payoff. In one example, the pop-up structure is constructed to resemble a hamburger and the game piece is a pickle. The "payoff" area is located on the pop-up structure or hamburger. The user then places the game piece (pickle) onto the launch mechanism and launches the pickle in the direction of the hamburger. If it lands on the "payoff" area, then an audio clip will be initiated. As mentioned above, there may be a single audio clip that plays each time the game piece comes into contact with the "payoff" area or several different audio clips may play in sequence on a loop or may be randomly selected for playback. Audio may also be initiated upon opening the greeting card. Various different game pieces/pop-up structure combinations may be used, such as basketball/basketball hoop, football/goal posts, etc. The greeting card, pop-up structure, game piece, launch mechanism, and audio playback may all be coordinated with the same theme, as discussed above.

In a fourth embodiment, the greeting card of the present invention may be used in combination with a digital device, such as a smart phone or tablet. A web-based application may be developed to specifically interact with the greeting card and game piece. For example, an application may be developed for a tablet computer which may display a game board or one or more game targets. The application is programmed to respond in a certain way depending on where the game piece lands on the tablet screen. The game piece may be specially designed to work with the tablet or other electronic device. For example, most touch screen devices use a capacitive touch screen wherein a circuit is completed by the touch of a finger. The game piece may contain a conductive thread which, when in contact with the device screen, will imitate a finger touch, tap or swipe. This will allow the game piece to initiate or trigger some action by the tablet or other such device. For example, the tablet screen may contain various targets which trigger different audio or video when the game piece is placed thereon. The greeting card may contain a launch mechanism, as described above, which can be used to propel a game piece onto the screen of the tablet or other such device. The application may respond in various ways, such as, by triggering different audio and/or video depending on the location on which the game piece lands. The web-based application may be operative to simulate a basketball shooting contest, or other any other such game. The application may also be operative to have moving targets or targets which move across and/or around the screen, making it more difficult for the game piece to land on a specific location. The application may keep score for a single player or for two or more different players. Additionally, the game piece may serve as a token to unlock or to activate the downloaded game or app. The game or app may be unplayable until it is unlocked by the game piece. Specific technology and methods used for unlocking an application via a token is known to one of ordinary skill in the art and are not tied to any specific technology or method. Examples of using a token or game piece to unlock or activate a downloaded application include, but are not limited to: having a hidden code thereon which the user manually enters into the application as a password; having a digital watermark, QR code, augmented reality marker or other camera-based technology printed or embedded within the token or game piece; having printed electronics, foil stamping, conductive foam or other conductive technology printed on or embedded within the token or game piece to communicate with a multi-touch surface of a touchscreen device; and gesture or motion detection recognized by the application when viewed through a user's device camera or webcam. Once the application is initially unlocked the user is able to play or interact with the application. In operation, the greeting card recipient would receive and open the greeting card, which may have directions printed thereon for launching the web-based application on a tablet or other such device. Once the application has been opened, further instructions may be given on the tablet via audio and/or video, on how to unlock or activate the application or game and also on playing the game using the greeting card, game piece and launch mechanism. The application may contain a plurality of different games which the user can play along with the greeting card, game piece and launch mechanism. The application may also contain various user options, such as, but not limited to: screen color(s); difficulty level; number of players and other such settings. These settings may be set by the user before beginning to play the game. The application may be themed so as to compliment or coordinate with the physical greeting card. The theme of the greeting card and application may be a particular movie so that when the game piece interacts in some way with the touch screen, scenes of the movie may be played on the screen or sound clips may be initiated. The greeting card and corresponding application may have a birthday theme wherein the screen shows one or more burning candles and the game piece is used to extinguish or blow out the candles. Any number and variety of different themes are contemplated. The web-based application may contain a variety of different themed games which may be selected by the user or may be selected by the particular greeting card and game piece with which the application interacts.

While the examples disclosed herein have been described as having a magnetic trigger mechanism (with magnet embedded in game piece) other types of trigger mechanisms, such as, but not limited to: RFID technology, printed electronics or conductive ink have been considered and are considered to be within the scope of the present invention.

The greeting card embodiments described above may also contain a preview function which allows a consumer to hear the "payoff audio" sounds prior to purchasing the greeting card. The preview function may be, a separate switch mechanism which when activated by the consumer, will playback the audio that is triggered by the game piece coming in contact with the "payoff" area of the greeting card. This gives the consumer the ability to fully experience the greeting card sound effects before choosing a greeting card for purchase.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive. Other features and aspects of this invention will be appreciated by those skilled in the art upon reading and comprehending this disclosure. Such features, aspects, and expected variations and modifications of the reported results and examples are clearly within the scope of the invention where the invention is limited solely by the scope of the following claims.

What is claimed is:

1. An interactive greeting card, comprising:
    a greeting card body;
    an article associated with the greeting card body and decoupled from the greeting card body; and
    a launch mechanism attached to the greeting card body and configured to move the article relative to the greeting card body while the article is decoupled from the greeting card body,
        wherein positioning the article proximate a particular location on the greeting card body with the launch mechanism, while the article is decoupled from the greeting card body, triggers playback of a digital audio file via the greeting card.

2. The interactive greeting card of claim 1, wherein the greeting card body comprises a sound module operative to playback a first digital audio file in response to the article being positioned proximate the location.

3. The interactive greeting card of claim 2, wherein the sound module is further operable to playback a second digital audio file upon opening the greeting card.

4. The interactive greeting card of claim 2, wherein the greeting card further comprises a switch mechanism connected to the sound module, and the sound module is further operable to playback the first digital audio file in response to activation of the switch mechanism.

5. The interactive greeting card of claim 2, wherein the sound module is further operable to playback a message different from the first digital audio file in response to the greeting card body being open for a predetermined period of time.

6. The interactive greeting card of claim 2, wherein the greeting card body and the article include visual indicia indicating a particular theme, and wherein the first digital audio file corresponds to the particular theme.

7. The interactive greeting card of claim 1, wherein the greeting card body further comprises a pop-up structure operable to move between:
    a first position in which the pop-up structure extends substantially parallel to a panel of the greeting card body, and
    a second position in which the pop-up structure extends substantially perpendicular to the panel body.

8. The interactive greeting card of claim 1, further comprising a spring mechanism concealed by the greeting card body and operably connected to the launch mechanism.

9. An interactive greeting card, comprising:
    a greeting card body;
    an article associated with the greeting card body; and
    a mechanism configured to physically launch the article from the greeting card body to a location spaced from the greeting card body and proximate a digital device, wherein the article is operative to communicate with an application operable on the digital device when the article is moved from the greeting card body to the location by the mechanism.

10. The interactive greeting card of claim 9, wherein the mechanism is connected to the greeting card body and is configured to move the article from the greeting card body onto the digital device, the article being configured to activate the application once the article is disposed on the digital device.

11. The interactive greeting card of claim 9, wherein the article includes a digital watermark, a QR code, printed electronics, foil stamping, conductive foam, or an augmented reality marker configured to communicate with the application.

12. The interactive greeting card of claim 9, wherein the article is configured to cause the application to provide a first response when the article is disposed proximate a first location on the digital device, and wherein the article is configured to cause the application to provide a second response different from the first response when the article is disposed proximate a second location on the digital device different from the first location.

13. The interactive greeting card of claim 9, wherein the article is configured to unlock the application when the article is positioned proximate the digital device.

14. The interactive greeting card of claim 13, wherein the article is configured to cause the application to be unlocked at least partly in response to a motion detection device of the digital device sensing the article.

15. The interactive greeting card of claim 9, wherein the article is configured to cause the application to play a video on a display of the digital device at least partly in response to the article being positioned proximate the digital device.

16. The interactive greeting card of claim 15, wherein the greeting card body includes visual indicia indicating a particular theme, and wherein the video corresponds to the particular theme.

17. An interactive greeting card, comprising:
    a greeting card body;
    a launch mechanism attached to the greeting card body; and
    an article removably retained by the greeting card body, the article including a component configured to communicate with an application operable on a digital device when the article is positioned proximate the digital device,
        wherein the launch mechanism is configured to move the article to a location spaced from the greeting card body.

18. The interactive greeting card of claim 17, wherein the component of the article includes a digital watermark, a QR code, printed electronics, foil stamping, conductive foam, or an augmented reality marker.

19. The interactive greeting card of claim 17, wherein the article is operable to unlock the application on the digital device, and to trigger playback of at least one of an audio file or a digital file, via the digital device, once the application has been unlocked.

20. The interactive greeting card of claim 17, wherein the article is configured to cause the application to provide a first response when the article is disposed proximate a first location on the digital device, and wherein the article is configured to cause the application to provide a second response different from the first response when the article is disposed proximate a second location on the digital device different from the first location.

* * * * *